(12) United States Patent
Tai

(10) Patent No.: US 10,872,884 B2
(45) Date of Patent: Dec. 22, 2020

(54) ELECTROSTATIC DISCHARGE HANDLING FOR LATERAL TRANSISTOR DEVICES

(71) Applicant: SEMICONDUCTOR COMPONENTS INDUSTRIES, LLC, Phoenix, AZ (US)

(72) Inventor: Han-Chung Tai, Zhubei (TW)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

(21) Appl. No.: 16/848,637

(22) Filed: Apr. 14, 2020

(65) Prior Publication Data

US 2020/0243508 A1 Jul. 30, 2020

Related U.S. Application Data

(62) Division of application No. 16/132,545, filed on Sep. 17, 2018, now Pat. No. 10,658,354.

(51) Int. Cl.
*H01L 27/02* (2006.01)
*H01L 29/06* (2006.01)
*H01L 29/808* (2006.01)
*H01L 29/08* (2006.01)

(52) U.S. Cl.
CPC ...... *H01L 27/0262* (2013.01); *H01L 29/0619* (2013.01); *H01L 29/0847* (2013.01); *H01L 29/808* (2013.01)

(58) Field of Classification Search
CPC ............. H01L 27/0262; H01L 29/0619; H01L 29/0847; H01L 29/808; H01L 27/0248–0296; H01L 2224/8211; H01L 23/60–62; H01L 2224/8011; H01L 2224/8111

See application file for complete search history.

(56) References Cited

U.S. PATENT DOCUMENTS

| | | | | |
|---|---|---|---|---|
| 5,563,525 A * | 10/1996 | Lee | ...................... | H01L 27/0251 257/360 |
| 8,735,997 B2 * | 5/2014 | Hachiyanagi | ....... | H01L 29/7835 257/409 |
| 2002/0084490 A1 * | 7/2002 | Ker | ...................... | H01L 27/0292 257/355 |
| 2006/0113606 A1 * | 6/2006 | Kojima | ........... | H01L 21/823807 257/369 |
| 2008/0144242 A1 * | 6/2008 | Lai | ...................... | H01L 27/0262 361/56 |
| 2011/0241069 A1 | 10/2011 | Vashchenko | | |
| 2013/0161750 A1 * | 6/2013 | Chen | ...................... | H01L 29/749 257/357 |
| 2014/0177113 A1 * | 6/2014 | Gueorguiev | ........ | H01L 29/7816 361/56 |

(Continued)

*Primary Examiner* — Shahed Ahmed
(74) *Attorney, Agent, or Firm* — Brake Hughes Bellermann LLP

(57) ABSTRACT

A semiconductor transistor device includes a source region, a gate region having a p-type gate region and an n-type gate region, and a drain region having a p-type drain region and an n-type drain region. The p-type gate region, the n-type gate region, the p-type drain region, and the n-type drain region are positioned to provide, in response to an electrostatic discharge (ESD) voltage, a drain-to-gate ESD current path to at least partially discharge the ESD voltage.

20 Claims, 10 Drawing Sheets

(56) References Cited

U.S. PATENT DOCUMENTS

2017/0005194 A1     1/2017   Tsai et al.
2017/0077083 A1     3/2017   Fujiwara et al.
2018/0323184 A1*   11/2018   Hung .................. H01L 27/0259

\* cited by examiner

ELECTROSTATIC DISCHARGE HANDLING FOR LATERAL TRANSISTOR DEVICES

CROSS-REFERENCE TO RELATED APPLICATION

This application is a divisional of U.S. patent application Ser. No. 16/132,545, filed on Sep. 17, 2018, which is incorporated herein by reference in its entirety.

TECHNICAL FIELD

This description relates to the handling of electrostatic discharge in lateral transistor devices.

BACKGROUND

Electrostatic discharge (ESD) is a common difficulty in the manufacture and use of semiconductor transistors and related devices. ESD may occur, for example, due to an electrostatic charge imparted by a person or tool coming into unintentional contact with a conductive portion of a transistor, such as a drain contact or lead of the transistor. Such ESD has the potential to damage or destroy an affected transistor, and disrupt operations of connected circuitry and devices.

In particular, a transistor that is an ultra high voltage (UHV) device is susceptible to ESD damage. Existing models or standards for testing against device failure due to ESD, such as the Human Body Mode (HBM), demonstrate that existing ESD protection schemes provide protection up to about 1.5 kilovolts (kV), which is likely to be insufficient in many cases for UHV devices.

SUMMARY

According to one general aspect, a semiconductor transistor device includes a source region, a gate region having a p-type gate region and an n-type gate region, and a drain region having a p-type drain region and an n-type drain region. The p-type gate region, the n-type gate region, the p-type drain region, and the n-type drain region are positioned to provide, in response to an electrostatic discharge (ESD) voltage, a drain-to-gate ESD current path to at least partially discharge the ESD voltage.

According to another general aspect, a semiconductor transistor device includes a substrate of a first conductivity type, a first well region of a second conductivity type formed in the substrate, and a source region of the second conductivity type formed in the first well region. The semiconductor transistor device further includes a second well region of the first conductivity type formed in the first well region, a first gate region having the first conductivity type and formed in the second well region as part of a gate region, and a second gate region having the second conductivity type and formed in the second well region as part of the gate region. The semiconductor transistor device further includes a first drain region having the second conductivity type and formed in the first well region as part of a drain region, and a second drain region having the first conductivity type and formed in the first well region as part of the drain region. At least the second drain region, the first well region, the second well region, and the second gate region form a structure that provides, in response to voltage induced by electrostatic discharge (ESD), a drain-to-gate ESD current path.

The details of one or more implementations are set forth in the accompanying drawings and the description below. Other features will be apparent from the description and drawings, and from the claims.

DETAILED DESCRIPTION

The transistor devices described herein can include a drain-to-gate current path that provides for safe discharge of an ESD current that may occur in response to an ESD event. A resulting PNPN structure can be formed that defines, for example, a silicon-controlled rectifier (SCR), which establishes the drain-to-gate current path for ESD current. The drain-to-gate ESD current path protects the transistor from damage that would otherwise be caused by the ESD, including high ESD current levels that would be damaging if using existing ESD protection techniques.

Figure 1:
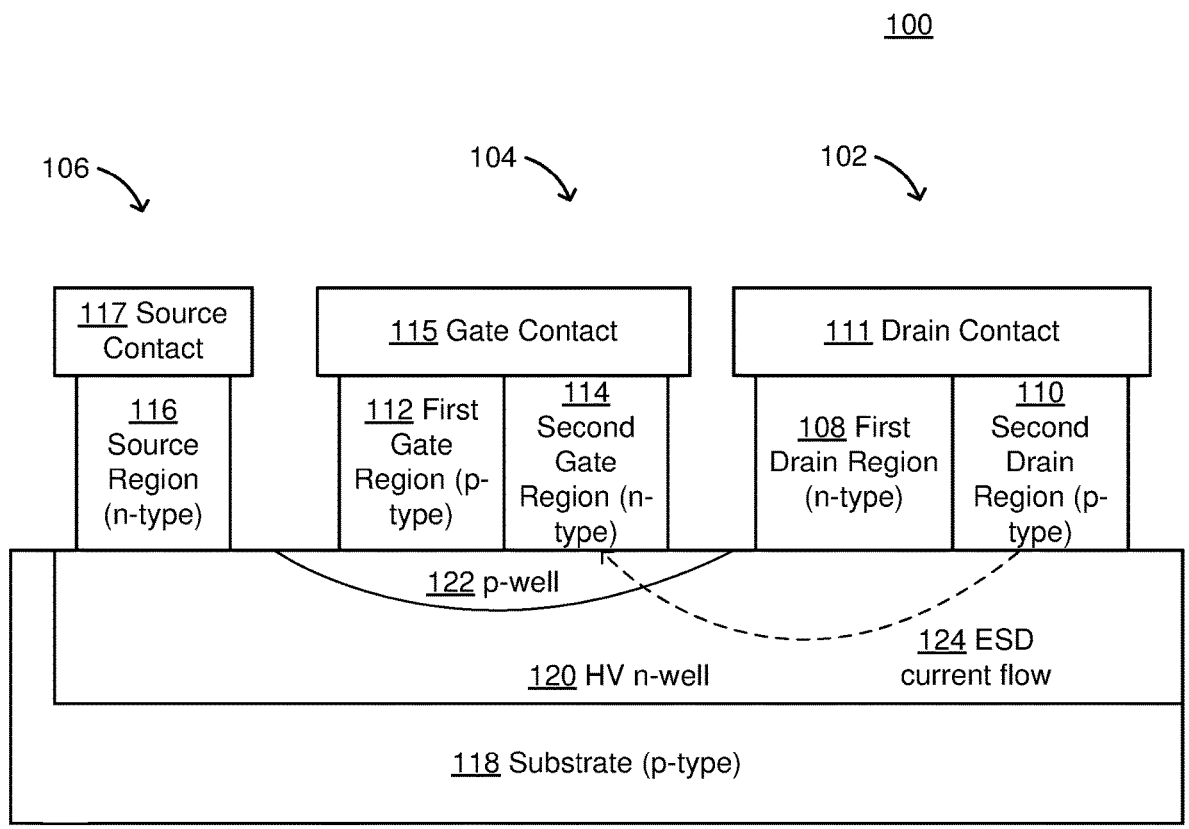
FIG. 1 is a side cross-section of portions of a representative lateral transistor with improved handling for ESD.

FIG. 1 is a side cross-section of portions of a representative lateral transistor 100 with improved handling for ESD. In the example of FIG. 1, the transistor 100 may represent various types of lateral transistors, including a lateral junction field effect transistor (JFET), or a lateral metal oxide semiconductor FET (MOSFET). In FIG. 1, the transistor 100 is illustrated in a simplified form, in order to clearly and concisely demonstrate and describe relevant features, in a manner that is inclusive of various specific implementations thereof.

For example, various insulating structures that may be included in such implementations are not specifically illustrated in FIG. 1 (such as a gate oxide of a MOSFET). By way of more specific example(s), FIGS. 3-7 provide example structures of a JFET implementation of the example of FIG. 1 that are illustrated and described in greater detail with respect thereto.

In the example of FIG. 1, the transistor 100 includes a drain 102, a gate 104, and a source 106. As described in detail, below, the transistor 100 includes a drain-to-gate current path (illustrated in FIG. 1 as ESD current flow 124) that provides for safe discharge of an ESD current that may occur in response to an ESD event, even when the ESD is, for example, 2 kV or higher.

In FIG. 1, the transistor 100 may represent an NPN transistor. In other example implementations, however, the conductivity types may be reversed.

In the NPN transistor of FIG. 1, the drain 102 thus includes first, n-type drain region(s) 108. As explained in detail, below, the drain 102 also includes second, p-type drain region(s) 110. A drain contact 111 is electrically connected to both drain regions 108, 110.

Meanwhile, the gate 104 includes a first, p-type gate region 112 that is part of the NPN structure. The gate 104 also includes a second, n-type gate region 114. A gate contact 115 is electrically connected to both gate regions 112, 114.

The source 106 includes a source region 116, which is n-type as part of the NPN transistor structure. The source also includes a source contact 117 that is electrically connected to the source region 116. Further in FIG. 1, the transistor 100 is illustrated as being formed on a substrate 118 that is p-type.

As may thus be observed from FIG. 1, both the drain 102 and the gate 104 contain both n-type and p-type regions, thereby defining four regions 108/110/112/114. In the event of an ESD, these four regions interact via electrically-shorted, intervening body regions 120, 122 of the transistor structure 100, in order to provide the ESD current path 124. Although the four regions 108/110/112/114 are illustrated in the example of FIG. 1 as shown, it is possible in other implementations that the regions may be implemented in a different order, as well.

Figure 2A:
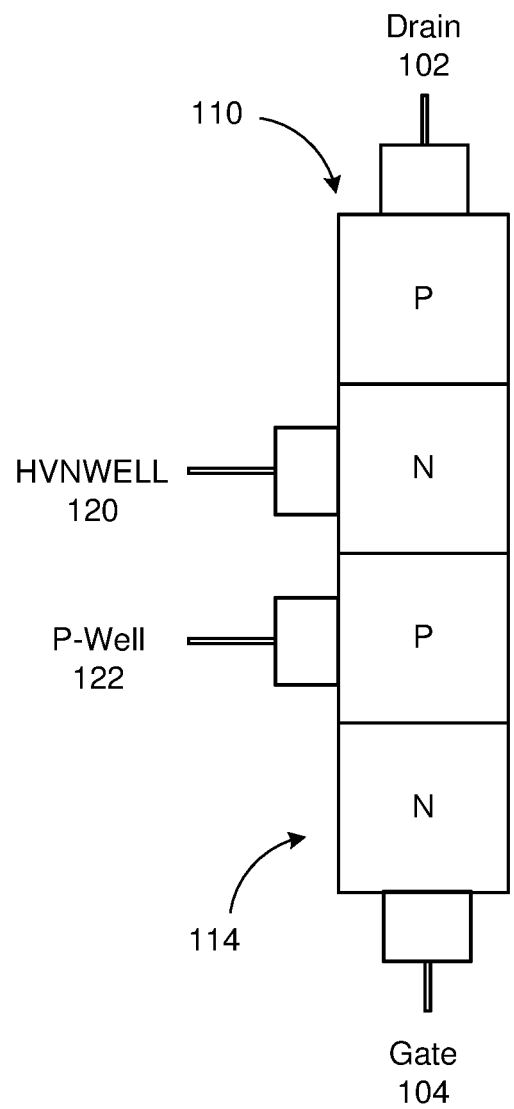
FIG. 2A is a circuit diagram for providing a gate-to-drain ESD current path for the transistor of FIG. 1.
Figure 2B:
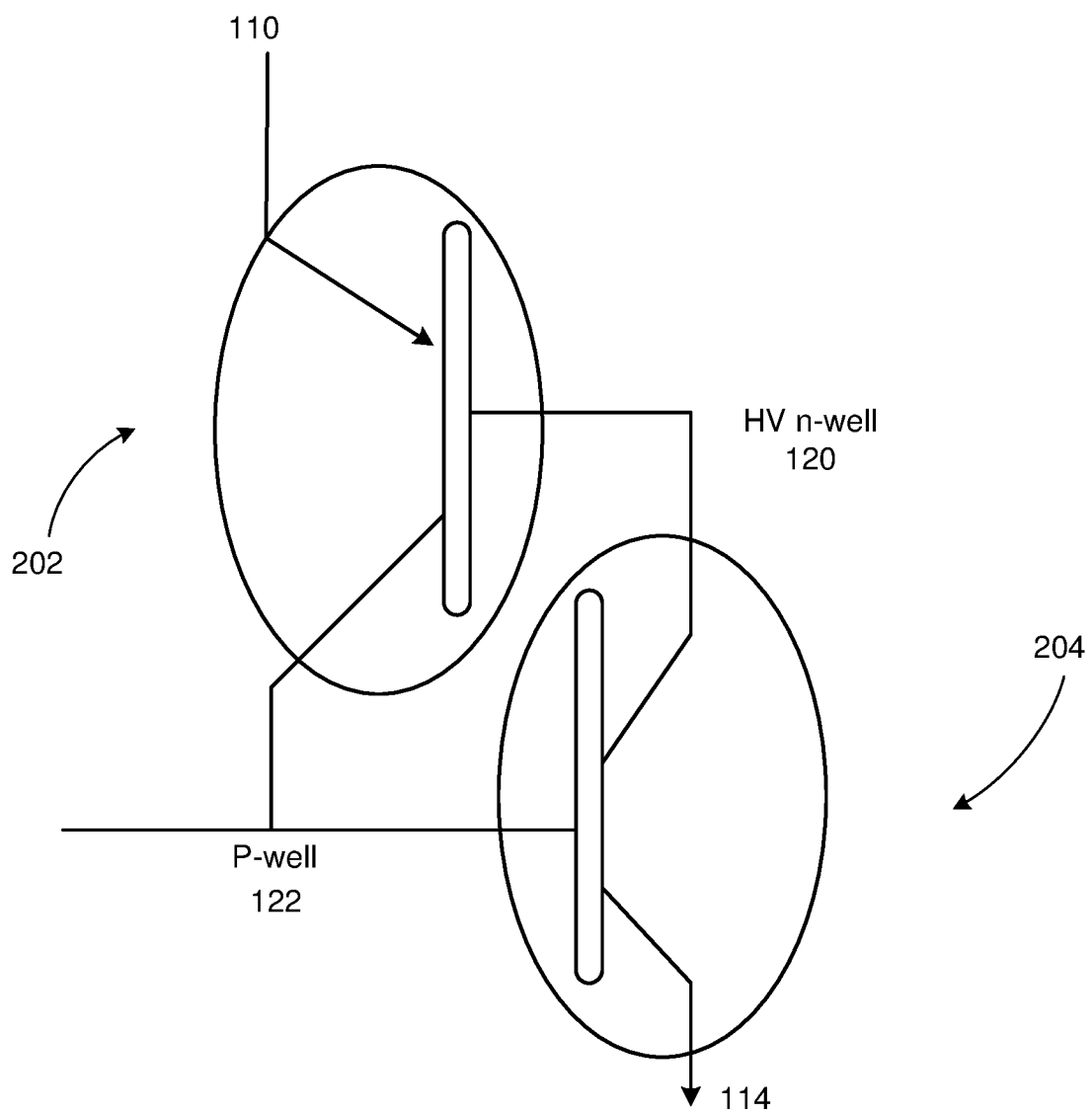
FIG. 2B is a circuit schematic illustrating operations of the circuit diagram of FIG. 2A during an ESD event.

As described in detail, below (and as illustrated in FIGS. 2A and 2B), a resulting PNPN structure is formed that defines a silicon-controlled rectifier (SCR), which establishes the referenced drain-to-gate current path 124 for ESD current. The drain-to-gate ESD current path 124 protects the transistor 100 from damage that would otherwise be caused by the ESD, including high ESD current levels that would be damaging if using existing ESD protection techniques.

In more detail, a high voltage (HV) n-well 120 formed in the p-type substrate 118 may represent a lightly-doped (n–) region, which may also be referred to as an epitaxial region. During an ESD event, the HV n-well 120 is electrically shorted to the n-type drain region 108, which may represent a heavily-doped (n+) region.

Similarly, p-well 122 may be formed within the HV n-well 120 (e.g., as a lightly-doped (p–) region), and may be electrically shorted to the second gate region 114, which may represent a heavily-doped (p+) region, during an ESD event. It will be appreciated that a depth or lateral extent of the p-well 122 may be altered, depending on a type of the lateral transistor 100 that is implemented. For example, the p-well 122 may extend closer to, or farther from, the drain 102.

As referenced above, FIG. 1 represents a side cross-section of a semiconductor transistor device. In various implementations, some of which are illustrated and described below, the drain 102 may be formed at a center portion of the semiconductor transistor device, while the gate 104 may be formed around and surrounding the drain 102. Further, the source 106 may be formed around and surrounding the gate region 104. For example, the gate 104 may be formed as a circle, oval, concentric shape around the drain 102, while the source 106 may be formed in the same shape as the gate 104, and surrounding (e.g., surrounding concentrically) the gate 104. Of course, such formations would be observable in a top view of the transistor device 100, corresponding to the top view of, e.g., FIG. 3, but are not directly observable in the side view of FIG. 1.

In such implementations, an ESD guard ring structure may be provided around and surrounding the source 106. Such an ESD guard ring structure may be used to provide a secondary ESD current path to the drain-to-gate ESD current path 124, as discussed in detail, below.

In the present description, the substrate 118 may be referred to as defining a horizontal plane, so that the p-type gate region 112, the n-type gate region 114, the n-type drain region 108, and the p-type drain region 110 may be considered to extend in a parallel direction along the horizontal plane of the substrate. Thus, the term lateral, or lateral transistor or similar, should be understood to refer to a transistor structure that extends horizontally in the above sense. Further, the PN junctions of the PNPN structure described herein may be understood to be aligned at least partially vertical, relative to the horizontal direction of the substrate 118.

FIG. 2A is a circuit diagram for providing the gate-to-drain ESD current path 124 for the transistor of FIG. 1. FIG. 2B is a circuit schematic illustrating operations of the circuit diagram of FIG. 2A during an ESD event. In FIG. 2A, as described above, the p-type second drain region 110 forms a first p-n junction with the HV n-well 120 (which is electrically shorted to the n-type first drain region 108 during an ESD event). Further, the p-well 122 (which is electrically shorted to the p-type first gate region 112 during the ESD event) forms a second p-n junction with the n-type, second gate region 114. Meanwhile, an NP junction is formed between (e.g., formed at an interface between) regions 120, 122.

FIG. 2B is a circuit schematic illustrating that the operation of the circuit of FIG. 2A may be represented using a pair of coupled bipolar junction transistors (BJTs) 202, 204. In FIG. 2B, regions 110 and 114 represent, respectively, primary anode and cathode terminals, which are across all four PNPN layers 110/120/122/114.

Generally speaking, when the anode 110 is at a positive potential relative to the cathode 114 (with no voltage applied at the gate 122 of the transistor 204), both the first and second PN junctions are forward biased, while the middle NP junction is reverse biased (so that no conduction takes place). During an ESD event, the anode voltage at 110 increases beyond a breakdown voltage, causing breakdown of the middle NP junction at the interface between N-type layer 120 and P-type layer 122, and thereby causing conduction of the circuit of FIGS. 2A/2B. Conduction will continue until, e.g., the ESD event has ended (i.e., the anode voltage is no longer present). Specific example values or value ranges for corresponding implementations of the transistor 100 of FIG. 1 are provided below, e.g., with respect to FIG. 8.

Figure 3:
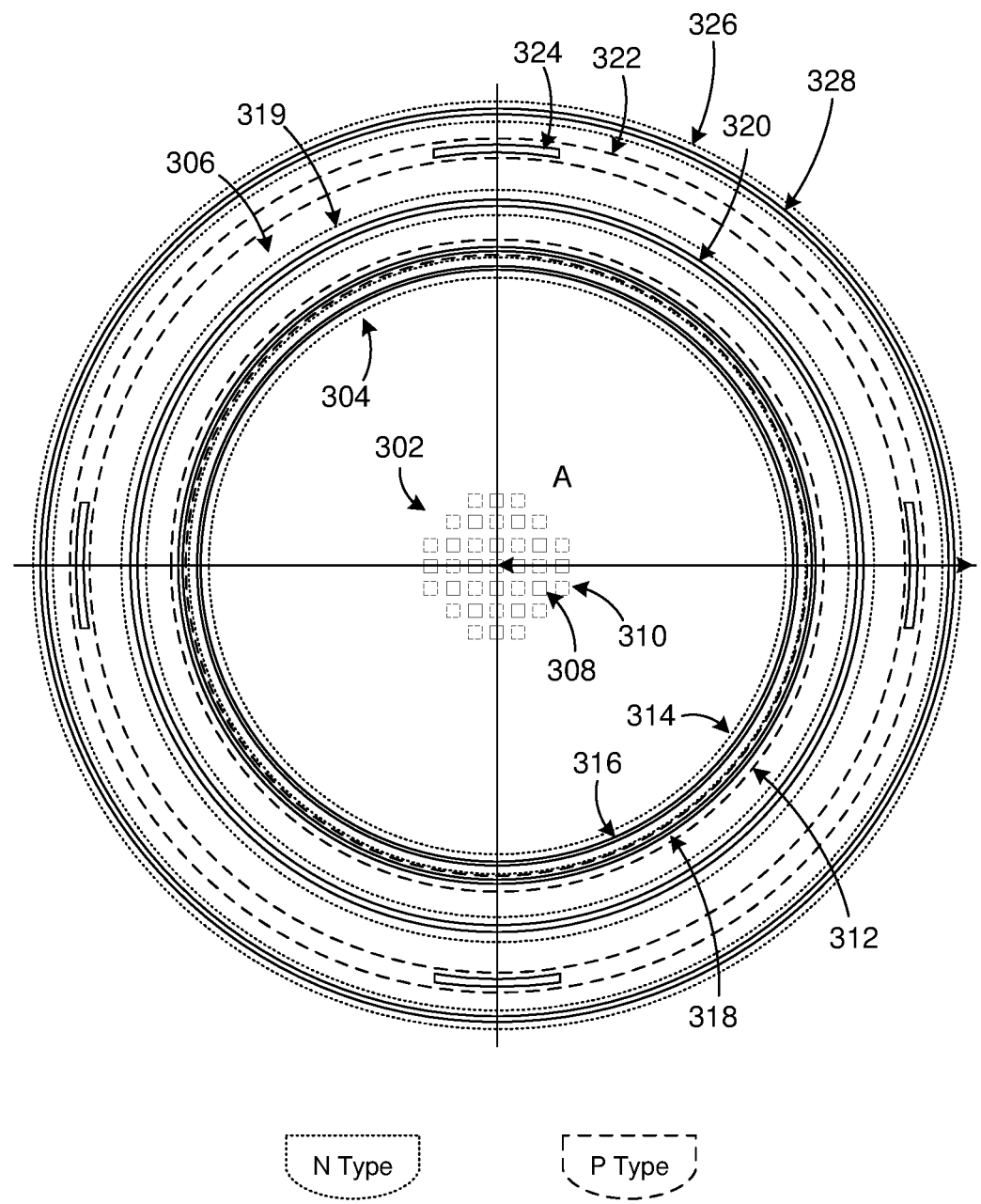
FIG. 3 is a top view of an implementation of a semiconductor transistor structure in accordance with the example of FIG. 1.

FIG. 3 is a top view of an implementation of a semiconductor transistor structure in accordance with the example of FIG. 1. FIG. 3 illustrates example configurations for a drain 302, gate 304, and source 306. Consistent with the above description of FIG. 1, the drain 302 includes a first, n-type drain region 308, and a second, p-type drain region 310.

Also consistent with FIG. 1, the gate 304 includes a p-type gate region 112, and an n-type gate region 114. The p-type gate region 112 is partially covered by a contact lead 118, while the n-type gate region 114 is partially covered by a contact lead 116.

Similarly, the source 306 includes n-type region 319, and is partially covered by a contact lead 320. Example details of the various contact leads, and associated contacts (including those of the drain region 302), are further illustrated in FIGS. 4-7.

Also in FIG. 3, an ESD guard ring structure includes an n-doped guard ring 322 and associated contact lead portion(s) 324, along with a p-doped guard ring 326 and associated contact lead 328. Further details of the ESD guard rings 322, 326 are illustrated and described below, including in the cross-section of FIG. 7.

In general, the ESD guard rings 322, 324 provide an additional or alternative ESD current path in the event of an ESD, in addition to the drain-to-gate ESD current path 124 referenced above. In particular, as described below, the guard rings 322, 324 provide a drain-to-guard ring ESD current path that also defines the type of PNPN structure referenced above, which may be considered to form a Silicon Controlled Rectifier (SCR), using the n-doped drain region 108 and the p-doped drain region 110.

Figure 4:
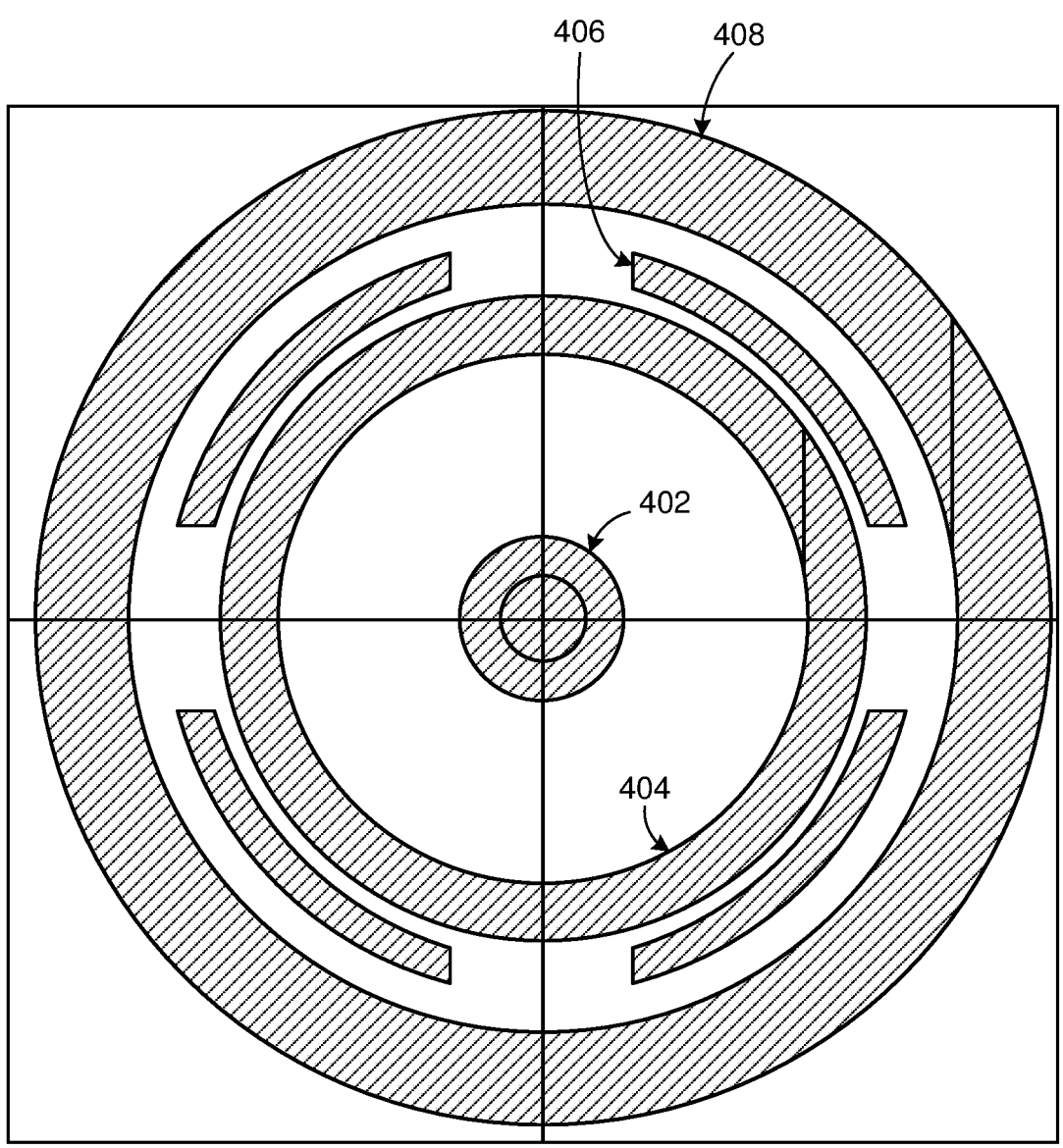
FIG. 4 is a top metal view of the transistor structure of FIG. 3.

FIG. 4 is a top metal view of the transistor structure of FIG. 3. As shown, and as may be appreciated from the example of FIG. 3, FIG. 4 illustrates a drain metal contact 402, a gate metal contact 404, and source metal contacts 406. FIG. 4 also illustrates an ESD guard ring metal contact 408.

FIGS. 3 and 4 thus illustrate an example implementation in which the transistor structure 100 has a circular or ring shape. Of course, other configurations are possible, such as a stadium, oval, racetrack, or elliptical configurations.

Figure 5:
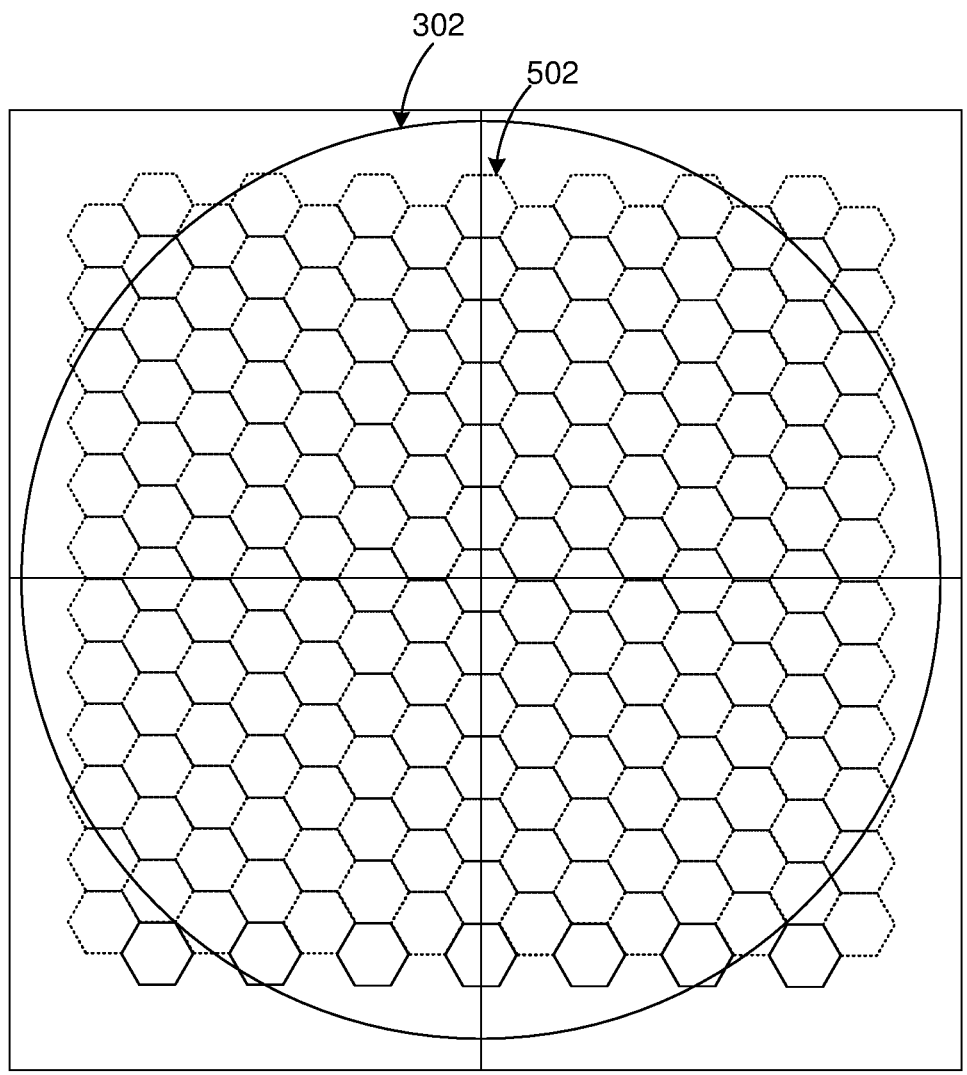
FIG. 5 is an example zoomed-in view of a drain region of the transistor structure of FIGS. 3 and 4, illustrating a honeycomb design.
Figure 6:
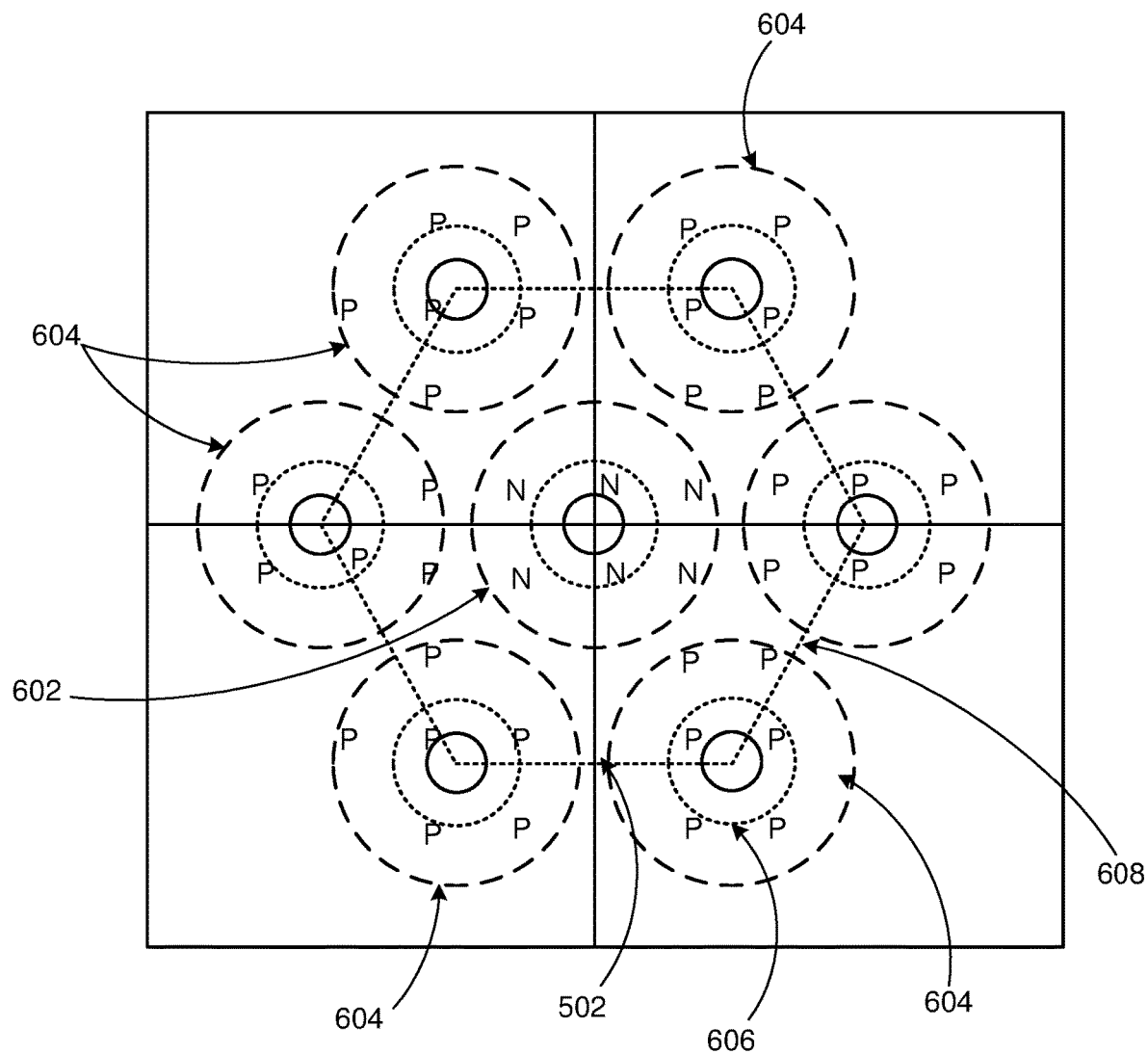
FIG. 6 is a further zoomed-in top view of the honeycomb design of FIG. 5.

FIG. 5 is an example zoomed-in view of the drain region 302 of the transistor structure of FIGS. 3 and 4, illustrating a honeycomb design 502. FIG. 6 is a further zoomed-in top view of the honeycomb design 502 of FIG. 5. Although the honeycomb design 502 is presented as a non-limiting example and is presented merely by way of example, FIG. 6 illustrates an example implementation in which the drain 302 includes an n-type portion(s) 602 representing examples of the n-type drain region 108. The n-type region 602 may be surrounded by, in the example, six p-type regions 604 representing the p-type drain region 110. FIG. 6 also illustrates electrical contact portions 606 and layer 608 that provide a common electrical potential (drain voltage) at each of the illustrated drain regions 602/604.

In general, various ratios of NPN/PNPN may be used, in manners designed to optimize the desired ESD discharge characteristics. For example, including more p-type material (e.g., p-type drain region 110, or p-type gate region 112) may enable larger ESD current. The areas of the various p-type materials may also be optimized, as well as ratios of P:N type regions in either or both of the gate or drain regions.

Figure 7:
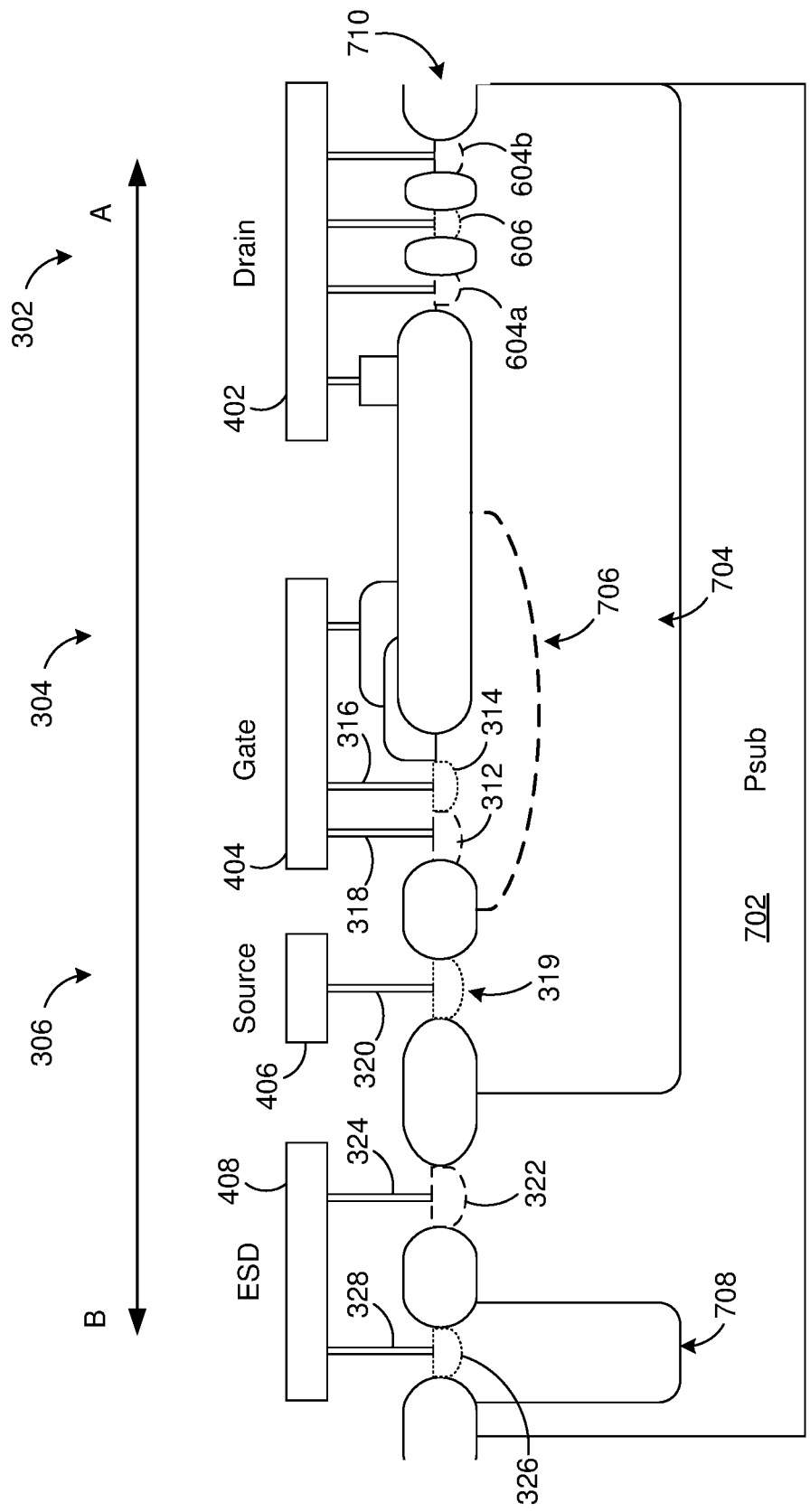
FIG. 7 is a side cross-section view of the transistor structure of FIGS. 3-6, taken along line A-B of FIG. 3.

FIG. 7 is a side cross-section view of the transistor structure of FIGS. 3-6, taken along line A-B of FIG. 3. In FIG. 7, numerical reference labels are continued from earlier FIGS. 3-6, but shown in cross-section. In particular, the example p-type drain region 604 of FIG. 6 is shown in cross-section, but because the p-type drain region 604 is an (isolation) island or pillar structure in FIG. 6 that encloses the n-type drain region 606 (which has a similar island/pillar structure), the cross-section of FIG. 7 illustrates radial portions 604a, 604b of the region 604, on either side of the cross-section view of n-type drain region 606.

Further in FIG. 7, a substrate region 702 is illustrated as being p-type, and labelled as $P_{sub}$. HV n-well region 704 is contained within the substrate region 702, and corresponds generally to the HV n-well 120 of FIG. 1. Similarly, p-well 706 corresponds to p-well 122 of FIG. 1.

The ESD guard ring contact 408, and associated ESD guard ring regions 322, 324, 326, 328, are also illustrated in FIG. 7 in cross-section. In particular, the p-type region 322 is illustrated as being formed in the p-type substrate 702, and the n-type region 326 is illustrated as being formed in an n-type well region 708. In this way, both majority and minority charge carriers may be collected, and the heavily-doped regions 324, 328 may reduce resistance in the ESD guard ring area.

As referenced above, during an ESD event, a second ESD discharge current path may occur between the drain 302 and the ESD guard ring structure of FIG. 7. In other words, the drain-to-gate ESD current path 124 of FIG. 1, and similar current path of FIG. 3, may occur in conjunction with this second, drain-to-ESD guard ring current.

For example, and similar in structure and operation to the description of the circuits of FIGS. 2A and 2B, above, this additional drain-to-ESD guard ring current path may occur in the context of a silicon controlled rectifier (SCR). Specifically, the corresponding PNPN structure of FIGS. 2A and 2B may be formed by a combination of the p-type drain region 604, the HV n-well region 704, the electrically-shorted p-type regions 702 and 322, and the electrically-shorted n-type regions 708 and 326.

Finally in FIG. 7, various insulating structures may be included, in order to facilitate formation and electrical separation of the various device regions of FIG. 7. Although not separately labelled and discussed, such insulating regions are represented by insulating region 710, which may be an oxide or any appropriate type of insulator.

Figure 8:
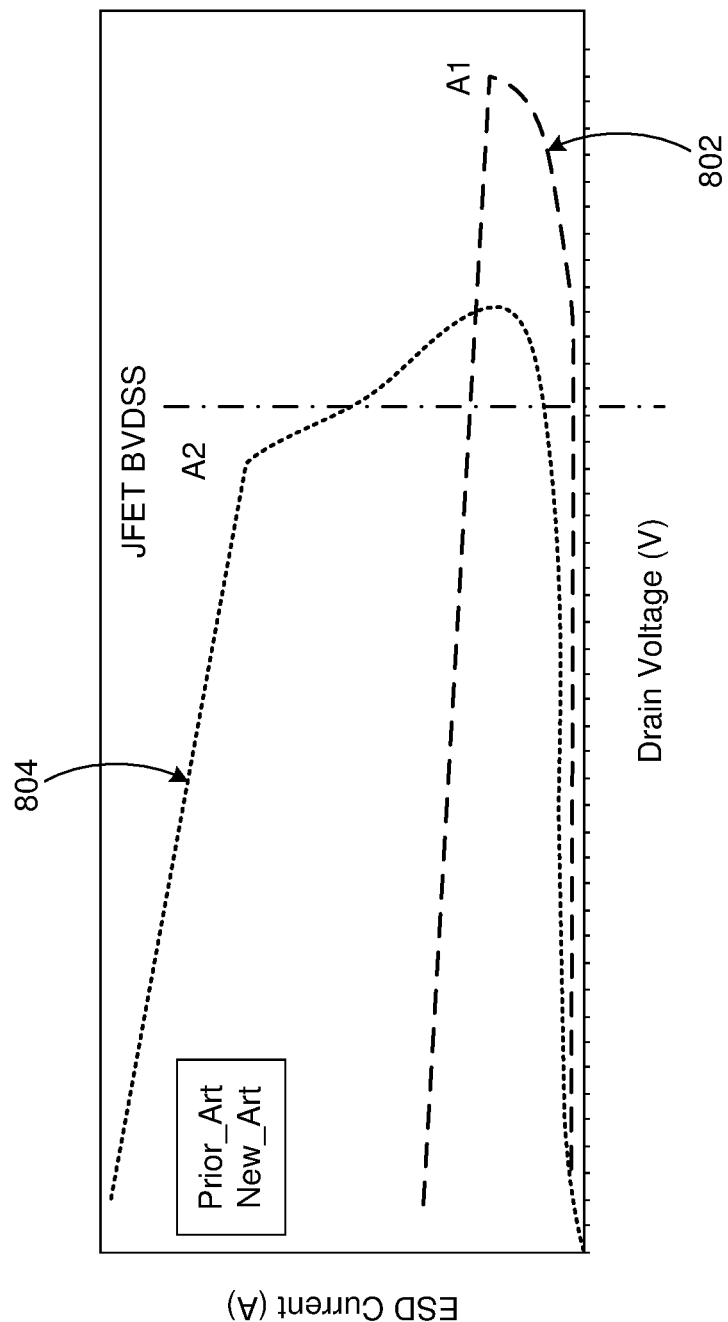
FIG. 8 is a graph showing an I-V curve for ESD current against drain voltage, for the transistor structure of FIGS. 3-6, as compared against an example transistor structure.

FIG. 8 is a graph showing an I-V curve for ESD current against drain voltage, for the transistor structure of FIGS. 3-6, as compared against an example transistor structure. Specifically, an I-V curve 802 illustrates an example of a type of existing ESD protection scheme, in which a drain-to-gate NP (reverse-biased) diode structure is used for ESD protection, and in which a JFET breakdown voltage BVDSS is set to occur within a specific range of, e.g., 600-900V, e.g., about 650V.

In the example, a breakdown overshoot phenomenon is observed in response to an ESD event, in which a snapback characteristic occurs in which a voltage of about 900V is reached (corresponding to an ESD current labelled in FIG. 8 as A1, which may be, e.g., about 0.9 A), before snapback occurs. In other words, by the time that the reverse-biased diode formed between the drain and the gate is conducting current, damage to the JFET structure is likely to have already occurred.

In contrast, as shown in the I-V curve 804, the PNPN structure described herein provides a significant reduction in the breakdown overshoot. Specifically, the SCR structure is turned on and conductive in response to an ESD event much more quickly than in the example I-V curve 802.

In more detailed examples, it may occur that a typical power supply for the JFET of curve 804 is 110V or 220V, so that, during normal operation, any voltage spikes are not higher than about 500V, and JFET breakdown does not occur. Also in this normal operating region, as referenced above, the p-type drain region (e.g., 110 in FIG. 1, or 604 in FIGS. 6 and 7) does not conduct current, or conducts a minimal/negligible current. Meanwhile, the corresponding n-type drain region (e.g., 108 in FIG. 1, or 606 in FIGS. 6 and 7) performs the normal drain functions in conducting current to the source 106 of FIG. 1 or 306 of FIGS. 3, 6, 7.

By its nature, an ESD event is characterized by a very fast rise in voltage, causing a correspondingly fast rise in potential of the p-type drain region 110/604. This rise in potential is faster than a corresponding rise in potential of the associated HV n-well region (e.g., 120 of FIG. 1, or 704 of FIG. 7). As a result, a 0.7V potential difference occurs at the intervening PN junction, and a forward bias is created. This forward bias acts to turn on the structure of FIGS. 2A and 2B.

Put another way, for the curve 802, an ESD voltage of, e.g., 2 kV will cause breakdown at the BVDSS of 650V, but insufficient energy will be imparted to initiate the snapback condition until after a significant overshoot has already occurred, as described and illustrated above.

For the curve 804 corresponding to FIGS. 1-7, snapback is initiated much sooner following the BVDSS of, e.g., 650V. Even for extremely high ESD voltage of, e.g., 2 kV-4 kV, the SCR structure of FIGS. 2A and 2B will be activated, and will conduct current up to about, e.g., 2.8 A (corresponding to an example of the current A2 in FIG. 8). As the PNPN structure of FIGS. 2A and 2B thus has a much higher current gain for the drain-to-gate ESD current path (e.g., up to three times higher, or more), the drain-to-gate ESD current path may be implemented as the primary or majority overflow conduction path, while a current path that involves the type of ESD guard ring described above may be used as a secondary or overflow current path.

Finally with respect to FIGS. 1-8, in some implementations, it is assumed that the source (e.g., 106, 308) is left floating (e.g., unconnected) for purposes of wafer-level or other testing scenarios. In these scenarios, ESD current at the drain 102, 302 only has the two current paths described herein for discharge, i.e., drain-to-gate or drain-to-ESD guard ring.

Figure 9:
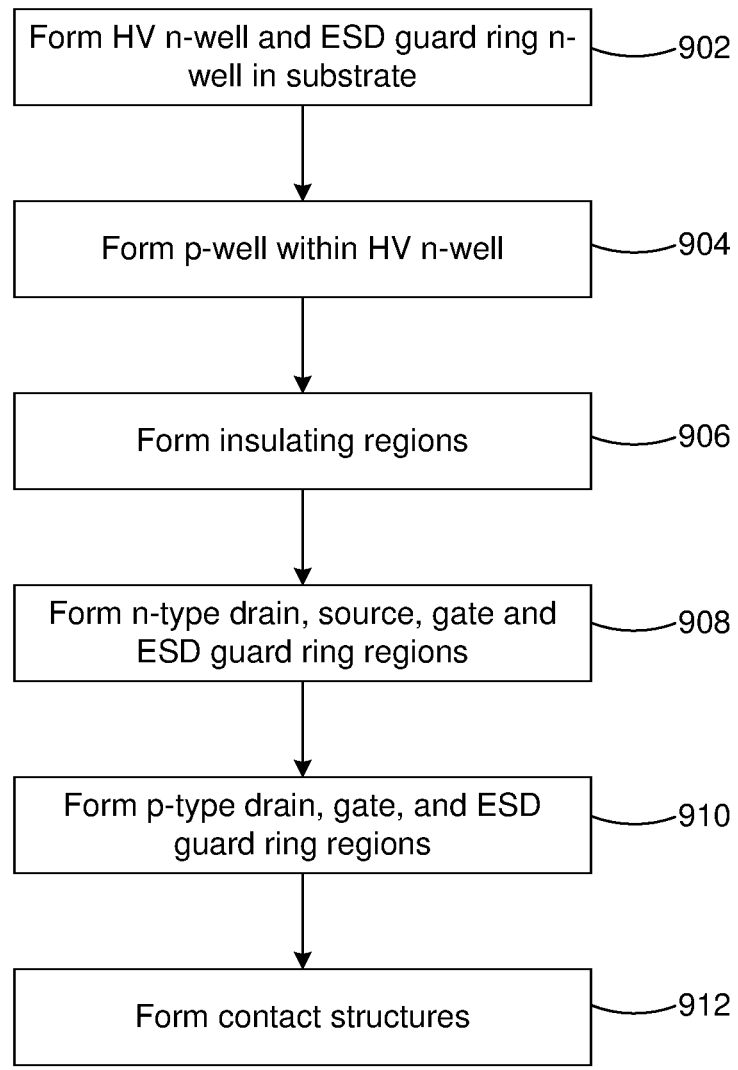
FIG. 9 is a flow chart illustrating example operations for a method for making a transistor structure in accordance with FIGS. 1-7.

FIG. 9 is a flow chart illustrating example operations for a method for making a transistor structure in accordance with FIGS. 1-8. FIG. 9 is a high-level description of an example method(s). While FIG. 9 is illustrated as a set of sequential operations, it will also be appreciated that, in various implementations, two or more of the operations of FIG. 9 may be implemented together as a single step, or in parallel with one another. Similarly, any single operation of FIG. 9 may be implemented as two or more sub-operations, which may be in series or in parallel with one another. Further, the operations may be implemented in a different order than that shown, and additional or alternative operations may be included, as well.

In the example of FIG. 9, with reference to FIGS. 1 and 7, an HV n-well 120, 704 is formed in a p-type substrate 118, 702 (902). A p-well 122/706 is formed in the HV n-well 120, 704 (904). Insulating regions 710 may then be formed (906).

N-type regions may be formed in corresponding regions of the drain 102, 302, the gate 104, 304, and the source 106, 306, as well as for the ESD guard ring structure (908). Specifically, as referenced above, the n-type drain regions 108, 606 may be formed as pillar or island regions on a surface of the HV n-well 120, 704. The various n-type regions 314, 319, 328 of the gate, source, and ESD guard ring, respectively, may be formed in the circular or racetrack types of configurations referenced above.

Similarly, p-type regions may be formed in corresponding regions of the drain 102, 302, the gate 104, 304, and the ESD guard ring structure (918). Specifically, as referenced above, the p-type drain regions 110, 604 may be formed as pillar or island regions on the surface of the HV n-well 120, 704, and surrounding the n-type pillars 108, 606. The various p-type regions 312, 324 of the gate and ESD guard ring, respectively, may be formed in the circular or concentric types of configurations referenced above.

Finally in FIG. 9, corresponding contact structures may be formed (912). For example, various examples of the leads and metal contacts are provided above, but it will be appreciated that other suitable choices for configuration and composition of contact layers may be made, as well.

Advantageously, it will be appreciated that the method of FIG. 9 provides for inclusion of both p-type and n-type regions within both of the drain and gate regions, to thereby form the types of PNPN SCR structures and functions described herein. In particular, these device structures may be obtained with little or no need for separate or additional masking operations, and without requiring additional layers in the various lateral transistor devices that may be implemented.

It will be understood that, in the foregoing description, when an element, such as a layer, a region, a substrate, or component is referred to as being on, connected to, electrically connected to, coupled to, or electrically coupled to another element, it may be directly on, connected or coupled to the other element, or one or more intervening elements may be present. In contrast, when an element is referred to as being directly on, directly connected to or directly coupled to another element or layer, there are no intervening elements or layers present. Although the terms directly on, directly connected to, or directly coupled to may not be used throughout the detailed description, elements that are shown as being directly on, directly connected or directly coupled can be referred to as such. The claims of the application, if any, may be amended to recite exemplary relationships described in the specification or shown in the figures.

As used in the specification and claims, a singular form may, unless definitely indicating a particular case in terms of the context, include a plural form. Spatially relative terms (e.g., over, above, upper, under, beneath, below, lower, and so forth) are intended to encompass different orientations of the device in use or operation in addition to the orientation depicted in the figures. In some implementations, the relative terms above and below can, respectively, include vertically above and vertically below. In some implementations, the term adjacent can include laterally adjacent to or horizontally adjacent to.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

What is claimed is:

1. A method of making a semiconductor transistor device, the method comprising:
   forming a source region;
   forming a gate region having a p-type gate region and an n-type gate region;

forming a drain region having a p-type drain region and an n-type drain region;

forming a p-well at least partially under the gate region, and electrically shorted to the p-type gate region during an electrostatic discharge (ESD); and forming an n-well under the source region, the gate region, the p-well, and the drain region, and electrically shorted to the n-type drain region during the ESD.

2. The method of claim 1, comprising:

forming a part of a Silicon Controlled Rectifier (SCR) using the p-type gate region, the n-type gate region, the p-type drain region, and the n-type drain region form.

3. The method of claim 2, wherein the p-type drain region is larger than the n-type drain region.

4. The method of claim 3, comprising:

forming a part of a PNPN structure of the SCR using the p-type gate region, the n-type gate region, the p-type drain region, and the n-type drain region.

5. The method of claim 1, comprising:

forming the p-type gate region, the n-type gate region, the p-type drain region, and the n-type drain region in positions to provide, in response to the ESD, a drain-to-gate ESD current path to at least partially discharge the ESD.

6. The method of claim 1, comprising:

forming the drain region at a center portion of the semiconductor transistor device;

forming the gate region around and surrounding the drain region; and forming the source region around and surrounding the gate region.

7. The method of claim 6, comprising:

forming an ESD guard ring structure around and surrounding the source region.

8. The method of claim 7, wherein the ESD guard ring structure provides a secondary ESD current path to the drain-to-gate ESD current path.

9. The method of claim 1, wherein the semiconductor transistor device includes a lateral junction field effect transistor (lateral JFET).

10. The method of claim 1, wherein the semiconductor transistor devices includes a lateral metal oxide semiconductor field effect transistor (lateral MOSFET).

11. The method of claim 1, comprising:

forming the n-type drain region and the p-type drain region as pillar structures.

12. A method of making a semiconductor transistor device, comprising:

forming, in a substrate of a first conductivity type, a first well region of a second conductivity type;

forming a source region of the second conductivity type in the first well region;

forming a second well region of the first conductivity type in the first well region;

forming a first gate region having the first conductivity type and in the second well region as part of a gate region;

forming a second gate region having the second conductivity type in the second well region as part of the gate region;

forming a first drain region having the second conductivity type in the first well region as part of a drain region; and forming a second drain region having the first conductivity type in the first well region as part of the drain region, wherein at least the second drain region, the first well region, the second well region, and the second gate region form a structure that provides, in response to voltage induced by electrostatic discharge (ESD), a drain-to-gate ESD current path.

13. The method of claim 12, comprising:

forming the first well region at least partially under the gate region, and electrically shorted to the first gate region during the ESD; and forming the second well region including a high-voltage well formed under the source region, the gate region, the first well region, and the drain region, and electrically shorted to the second drain region during the ESD.

14. The method of claim 12, comprising:

forming the drain region at a center portion of the semiconductor transistor device, forming the gate region around and surrounding the drain region; and forming the source region around and surrounding the gate region.

15. The method of claim 14, further comprising:

forming an ESD guard ring structure around and surrounding the source region.

16. The method of claim 15, wherein the ESD guard ring structure provides a secondary ESD current path to the drain-to-gate ESD current path.

17. A method of making a semiconductor transistor device, the method comprising:

forming a source region;

forming a first gate region having a first conductivity type, as part of a gate region;

forming a second gate region having a second conductivity type, as part of the gate region;

forming a first drain region having the second conductivity type, as part of a drain region; and forming a second drain region having the first conductivity type, as part of the drain region, forming the drain region at a center portion of the semiconductor transistor device, forming the gate region around and surrounding the drain region; and forming the source region around and surrounding the gate region.

18. The method of claim 17, further comprising:

forming, in a substrate of the first conductivity type, a first well region of the second conductivity type;

forming the source region of the second conductivity type in the first well region;

forming a second well region of the first conductivity type in the first well region;

forming the first gate region having the first conductivity type in the second well region;

forming the second gate region having the second conductivity type in the second well region;

forming the first drain region having the second conductivity type in the first well region; and forming the second drain region having the first conductivity type in the first well region.

19. The method of claim 17, wherein at least the second drain region, the first well region, the second well region, and the second gate region form a structure in response to an electrostatic discharge (ESD) voltage, and conduct a drain-to-gate ESD current path to at least partially discharge the ESD voltage.

20. The method of claim 19, further comprising:
forming an ESD guard ring structure around and surrounding the source region, wherein the ESD guard ring structure provides a secondary ESD current path to the drain-to-gate ESD current path.

* * * * *